United States Patent
Li

(10) Patent No.: US 8,098,093 B1
(45) Date of Patent: Jan. 17, 2012

(54) EFFICIENT ENVELOPE TRACKING POWER SUPPLY FOR RADIO FREQUENCY OR OTHER POWER AMPLIFIERS

(75) Inventor: Yushan Li, Longmont, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 27 days.

(21) Appl. No.: 12/688,752

(22) Filed: Jan. 15, 2010

(51) Int. Cl.
*H03G 3/00* (2006.01)
*H03F 3/04* (2006.01)

(52) U.S. Cl. ........................................ 330/127; 330/297

(58) Field of Classification Search .................. 330/127, 330/297
See application file for complete search history.

(56) References Cited

U.S. PATENT DOCUMENTS

| | | | |
|---|---|---|---|
| 5,867,061 | A | 2/1999 | Rabjohn et al. |
| 7,511,578 | B2 | 3/2009 | Dupuis et al. |
| 7,598,809 | B2 | 10/2009 | Kobayashi |
| 7,855,599 | B2 * | 12/2010 | Yamanouchi ................ 330/136 |
| 2005/0068103 | A1 | 3/2005 | Dupuis et al. |
| 2006/0226905 | A1 | 10/2006 | Dupuis et al. |
| 2008/0315954 | A1 | 12/2008 | Staszewski et al. |
| 2009/0097591 | A1 | 4/2009 | Kim |
| 2009/0189695 | A1 | 7/2009 | Lai et al. |
| 2009/0289720 | A1 | 11/2009 | Takinami et al. |

OTHER PUBLICATIONS

Lars T. Jakobsen, et al., "Digitally Controlled Envelope Tracking Power Supply for an RF Power Amplifier", 2007 IEEE, p. 636-642.
Mikkel C. W. Hoyerby, et al., "Optimized Envelope Tracking Power Supply for Tetra2 Base Station RF Power Amplifier", 2008 IEEE, p. 777-783.

* cited by examiner

*Primary Examiner* — Robert Pascal
*Assistant Examiner* — Khiem Nguyen

(57) ABSTRACT

An apparatus includes an envelope tracking power supply configured to control a power amplifier. The power supply includes a first amplifier configured to receive an input voltage and generate a supply voltage for the power amplifier. The power supply also includes a second amplifier configured to receive a shifted input voltage. An output of the second amplifier is coupled to the first amplifier. The first amplifier is configured to maintain an operational mode of the power amplifier. The power supply could further include a third amplifier. An output of the third amplifier is coupled to an input of the second amplifier, and the third amplifier is configured to receive a second shifted input.

26 Claims, 5 Drawing Sheets

EFFICIENT ENVELOPE TRACKING POWER SUPPLY FOR RADIO FREQUENCY OR OTHER POWER AMPLIFIERS

TECHNICAL FIELD

This disclosure relates generally to power amplifiers. More specifically, this disclosure relates to an efficient envelope tracking power supply for radio frequency or other power amplifiers.

BACKGROUND

Wireless base stations are routinely used to support wireless communications with various wireless devices. As base station technology has evolved, base stations have often required the use of much more complex transmission schemes. These transmission schemes usually employ complex modulation techniques that often require linear power amplification. Linear power amplification is often performed by one or more power amplifiers (PAs).

Power amplifiers typically consume a significant amount of power in base stations. For example, in the majority of cases, this may account for more than half of the total power consumed by a base station. This typically increases the cost of operating the base station. Moreover, linear power amplification may require one or more radio frequency (RF) power amplifiers to operate in a "backed off" state. This state decreases a base station's overall efficiency because RF power amplifiers are much less efficient when in the backed off state.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 7, discussed below, and the various embodiments used to describe the principles of the present invention in this patent document are by way of illustration only and should not be construed in any way to limit the scope of the invention. Those skilled in the art will understand that the principles of the present invention may be implemented in any type of suitably arranged device or system.

Figure 1:
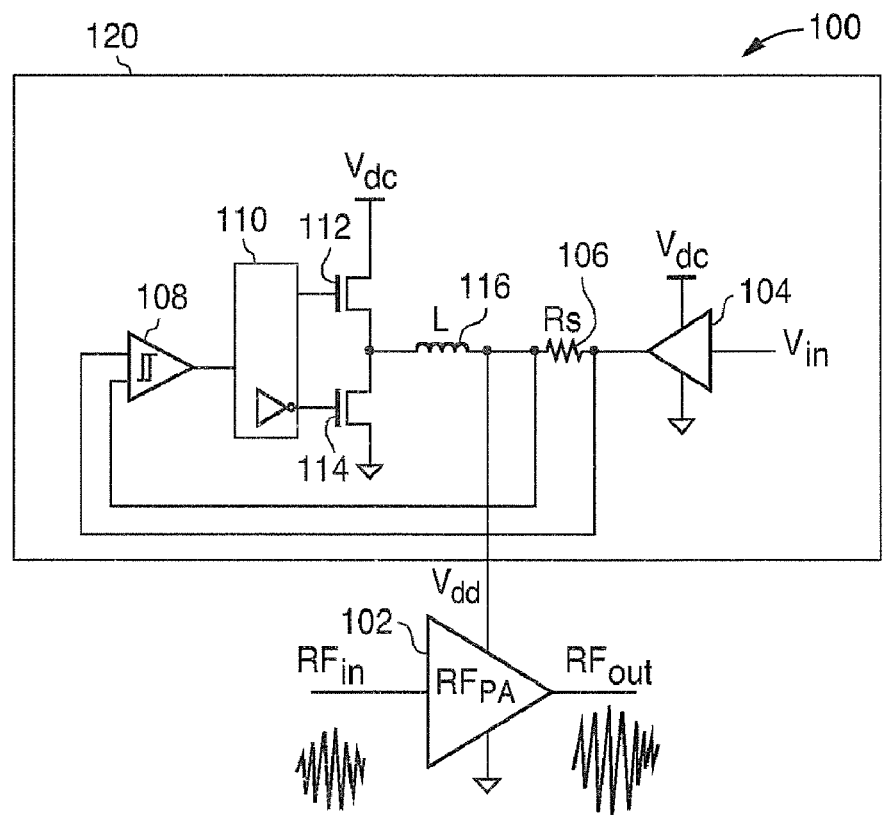
FIG. 1 illustrates an example linear-assisted architecture for power amplifier (PA) envelope tracking according to this disclosure.

FIG. 1 illustrates an example linear-assisted architecture 100 for power amplifier (PA) envelope tracking according to this disclosure. In the context of a PA, envelope tracking (ET) refers to a process in which a dynamically changing voltage is applied to a PA to ensure that the PA remains in a linear operating region.

In the example embodiment shown in FIG. 1, the efficiency of a PA 102 is improved using an envelope tracking power supply 120. The PA 102 can operate in a linear mode, and its supply voltage $V_{dd}$ is provided by the envelope tracking power supply 120. The power supply 120 dynamically adjusts the supply voltage $V_{dd}$ to increase or maximize the efficiency of the PA 102 while maintaining a sufficient linearity of the PA 102 in the linear mode. The supply voltage $V_{dd}$ can be proportional to the envelope of an input signal coming into the PA 102 with a minimum supply voltage being clamped so that the gain variation of the PA 102 is tolerable. By continuously operating the PA 102 close to its saturation (but not too close to lose linearity), high efficiency can be maintained across all power levels. In the linear-assisted architecture 100 of FIG. 1, the power supply 120 is current controlled, DC power is provided to the PA 102 by a switching converter ("switcher") in the power supply 120, and AC power of the envelope is provided to the PA 102 by a linear amplifier in the power supply 120.

The PA 102 represents any suitable structure for amplifying an input signal. In this example, the PA 102 represents a radio frequency (RF) power amplifier capable of receiving an input signal $RF_{in}$ and generating an output signal $RF_{out}$. The power supply 120 represents any suitable structure for supplying power to a PA and implementing envelope tracking. Note that the embodiment of the envelope tracking power supply 120 shown in FIG. 1 is for illustration only. Other embodiments of the envelope tracking power supply 120 could be used without departing from the scope of this disclosure.

In the example shown in FIG. 1, the power supply 120 receives a power supply voltage $V_{dc}$ and an input voltage $V_{in}$. The power supply voltage $V_{dc}$ may represent a voltage received from a power supply. The input voltage $V_{in}$ may represent a voltage used to control the supply voltage $V_{dd}$ generated by the power supply 120. A linear amplifier 104 receives the input voltage $V_{in}$ as an input and is powered by the power supply voltage $V_{dc}$. The amplifier 104 amplifies the input voltage $V_{in}$ and operates to regulate the supply voltage $V_{dd}$ sent to the PA 102. The amplifier 104 includes any suitable structure for amplifying an input voltage in a substantially linear manner.

An output of the amplifier 104 is coupled to a resistor 106, which is coupled to a comparator 108. The resistor 106 represents any suitable resistive structure having any suitable resistance. A voltage drop across the resistor 106 is compared by the comparator 108, which could determine whether the voltage drop is greater than some threshold value. The comparator 108 represents any suitable structure for comparing inputs.

An output of the comparator 108 is coupled to a gate driver 110, which drives two transistors 112-114. The transistor 112 is coupled to the power supply voltage $V_{dc}$, and the transistor 114 is coupled to ground. By turning the transistors 112-114 on and off, the gate driver 110 can control the voltage provided to an inductor 118, which generates the supply voltage $V_{dd}$ for the PA 102. The inductor 118 is also coupled to the resistor 106. The gate driver 110 represents any suitable structure for driving one or more transistors. The transistors 112-114 represent any suitable switching devices, such as NMOS transistors. The inductor 118 represents any suitable inductive device having any suitable inductance.

Although FIG. 1 illustrates an example linear-assisted architecture 100 for PA envelope tracking, various changes may be made to FIG. 1. For example, while described as being used to amplify RF signals, the architecture 100 could be used to amplify any other suitable signals. Also, other embodiments of each circuit within FIG. 1 could be used without departing from the scope of this disclosure.

Figure 4:
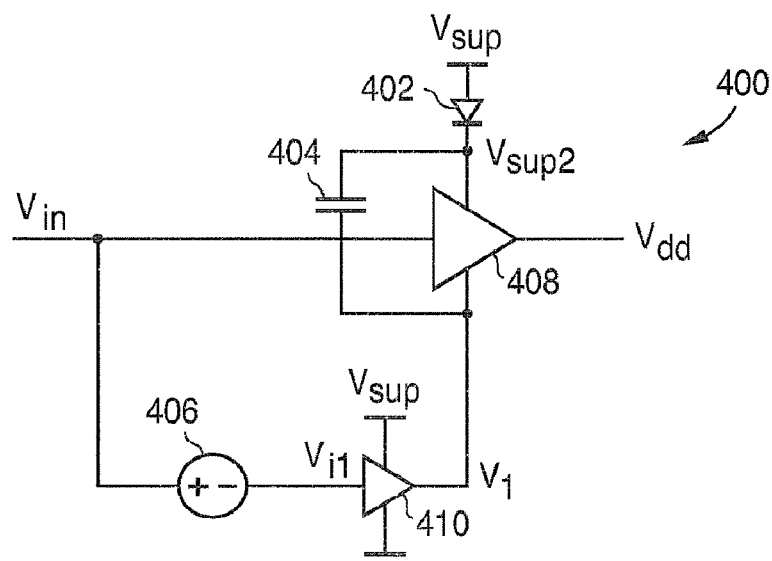
FIGS. 2 through 5 illustrate example embodiments of a linear amplifier used in the architecture of FIG. 1 according to this disclosure.
Figure 2:
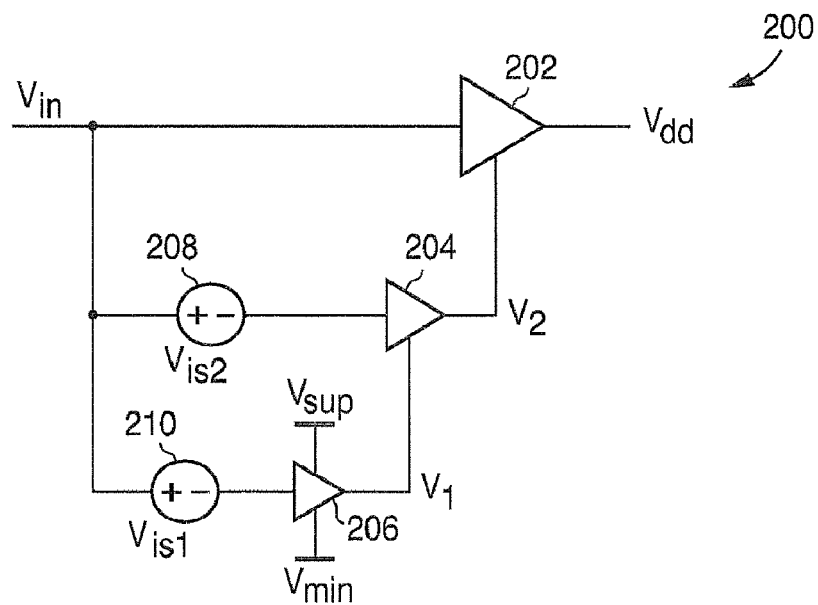
Figure 3:
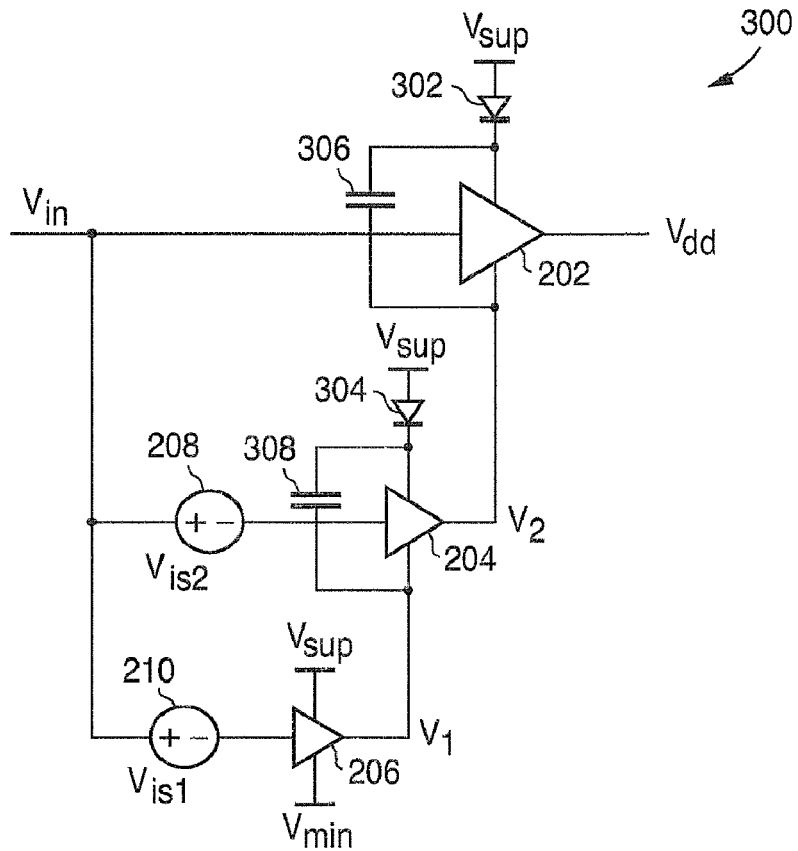

FIGS. 2 through 5 illustrate example embodiments of a linear amplifier used in the architecture of FIG. 1 according to this disclosure. In particular, FIGS. 2 through 4 illustrate example embodiments of the linear amplifier 104 in FIG. 1.

As shown in FIG. 2, an input voltage $V_{in}$ is supplied to an amplifier 202 and to level shifters 208-210. An amplifier 206 receives a shifted input voltage from the level shifter 210 and outputs a signal to an amplifier 204. The amplifier 204 receives a shifted input voltage from the level shifter 208 and outputs a signal to the amplifier 202. The amplifier 202 receives the input voltage $V_{in}$ and generates a supply voltage $V_{dd}$. It is understood that the output from amplifier 206 is used as the lower supply rail for the amplifier 204. The output from amplifier 204 is used as the lower supply rail for the amplifier 202.

The input voltage for each amplifier 204-206 is DC shifted by the level shifters 208-210, and the supply voltage $V_{dd}$ is generated by the amplifier 202. The amplifier 206 has input (from the level shifter 210 denoted $V_{ls1}$), with supply rails $V_{sup}$ and $V_{min}$ that may be governed by the following equations when the supply headroom is ignored:

$$V_{sup}=(V_{max}-V_{min})/N+V_{min} \quad (1)$$

$$V_{ls,i}=(V_{max}-V_{min})/N*(N-i) \quad (2)$$

Amplifier 204 works similarly to Amplifier 206. Here, $V_{sup}$ denotes the supply voltage for the amplifier 206, i denotes the level, Vmin and Vmax are the min and max levels of $V_{dd}$, and N refers to the stacked levels of the amplifiers. It is understood that the offsets from level shifters 208, 210 are preferably different. If an amplifier output is used as the supply rail, it is considered stacked. For example, V1 is the output of amplifier 206, and is being used as the lower supply rail for amplifier 204. V2 is the output of amplifier 204, and is being used as the lower supply rail for amplifier 202. Note that any number of additional amplifiers may be added to the linear amplifier 200 consistent with FIG. 2.

In FIG. 3, a linear amplifier 300 is similar to the linear amplifier 200 in FIG. 2. Here, the linear amplifier 300 includes the three amplifiers 202-206 and the two level shifters 208-210. In addition, the linear amplifier 300 includes diodes 302-304 and capacitors 306-308. The supply voltage $V_{sup}$ is coupled to the diodes 302-304. The diode 302 is coupled to the amplifier 202 and the capacitor 306, and the capacitor 306 is connected to the output of the amplifier 204. The diode 304 is coupled to the amplifier 204 and the capacitor 308, and the capacitor 308 is connected to the output of the amplifier 206.

This architecture may provide various benefits depending on the implementation. For example, the architecture in FIG. 3 may be more efficient as the loss would be effectively 1/N of the single amplifier case if the dominant energy is provided by the amplifier 202. This is because the supply voltage difference of the amplifier 202 can be 1/N of the full rail $V_{max}-V_{min}$. Also, the architecture in FIG. 3 may allow the use of lower breakdown voltage processes, which could have higher bandwidths (due to less capacitance) and smaller areas for the same function. Further, the architecture in FIG. 3 could deliver more output power with higher output voltages. In addition, the architecture in FIG. 3 may increase the output power capability of the amplifiers 202-206.

In some embodiments, the voltage difference between the two rails of each level may be constant $((V_{max}-V_{min})/N)$. It is understood that the voltage difference of the two rails in each level could be set differently with a different clamp voltage in each level during the capacitor charging phase.

A high output voltage $V_{dd}$ can be provided with the use of all three stacked amplifiers 202-206. When a high output voltage $V_{dd}$ is not present, the output of the amplifier 206 could be near its lower rail (near $V_{min}$) because its input is near $V_{min}$ due to the DC shift performed by the level shifter 210.

It is understood that all amplifiers may be in use during the operation of the circuit. The lower amplifier (204 and/or 206) may be in a clamp mode (e.g., a capacitor is being charged). The amplifier can be in the amplification mode, i.e., it is the supply for the higher level through the capacitor (instead of the higher level own supply through a diode).

In particular embodiments, the sizes of the amplifiers 202-206 can be similar. This may be done so that the amplifiers 202-206 provide the same peak current in a peak power condition during stacking. Also, in particular embodiments, the diodes 302-304 are of a high-voltage type.

In the example shown in FIG. 3, the floating supplies in the high levels are being generated by the charge pumps. In particular embodiments, the floating supply is generated similarly to a class-H amplifier. The voltage difference between the two supply rails may be constant, which is different from class-H supplies for digital subscriber line (DSL) applications where a lower rail is moved lower when an upper rail is moved higher. The capacitors 306-308 are charged most of the time through the diodes 302-304, respectively, using the supply voltage $V_{sup}$ when the lower rail of each level is low. When the input voltage $V_{in}$ is higher, the lower rail can be moved upwards to follow the input. During the delivery of low power levels, both capacitors 306-308 may be charged. During the delivery of medium power levels, the capacitor 308 may be charged, while the capacitor 306 may be discharged to supply the output voltage. During the delivery of high power levels, the capacitors 306-308 may be discharged to supply the output voltage.

In FIG. 4, a linear amplifier 400 includes a diode 402, a capacitor 404, a level shifter 406, and amplifiers 408-410. This arrangement is similar to that shown in FIG. 3, but the arrangement in FIG. 4 has two levels instead of three. Here, the level shifter 406 generates a voltage $V_{il}$ provided to the amplifier 410, which generates a voltage $V_l$ (such as 10-25V). Supply voltage $V_{sup2}$ is from $V_{sup}$ through the diode 402 when the capacitor is in the charging phase, and $V_{sup2}$ is generated by the lower amplifier 410 through the capacitor 404. The amplifier 408 generates the output voltage $V_{dd}$ (such as 10-40V). The lower rail for the amplifier 410 could be, for example, 10V. The gain from $V_{in}$ to $V_{dd}$ is 1 shown in the waveforms of FIG. 4. However, it is understood that the gain could be much higher for a low $V_{in}$.

Instead of using a single power buffer, two levels are stacked up in FIG. 3. The power loss from the linear amplifier 400 is effectively cut in half in the first order. This is because the supply voltage of the main amplifier 408 can be reduced to half, while the current consumption can remain the same. Most of the time, the amplifier 408 is the one that delivers the output power. During peak power levels, the capacitor 404 could supply approximately half of the peak power, and the amplifier 410 could supply approximately the other half of the peak power. In particular embodiments, the amplifier 410 delivers the same current as the amplifier 408 in the peak power case, so its chip area can be doubled, but the linear amplifier's power loss is cut by half. In further embodiments, when the input power is higher, the lower rail is moving upward following the input, the output power is being delivered partly by the lower level amplifier through the capacitor, and partly by the stored energy in the capacitor.

When a charge pump is used, it may require peak power occurring infrequently so that capacitors can be replenished before being depleted too much for intolerable voltage drops. This is normally the case for envelope signals with large peak-to-average ratios.

In the above description, it has been assumed that all amplifiers have rail-to-rail outputs. This, however, is not necessary. In many situations, a Darlington source-follower can be used for high output currents, so the output voltage swing may be within ±3V of its supply rails. In order to have an output with the required swing, the supply headroom can be increased to accommodate the output, and the DC level shifting offsets can be optimized, as well.

The efficiency of a linear amplifier can be further improved with the consideration that its main amplifier output source-follower supplies do not have to be the same as the amplifier's drivers. This is because the drivers may need a higher voltage for their upper rails and a lower voltage for their lower rail than the output devices. By optimizing the rails of the driver and output devices, the efficiency is further improved. This may be considered a special case of a class-G amplifier. When the output swing is small, the efficiency can be significant. This is particularly true for the multi-level architecture in FIG. 2 since the full swing is divided over multiple levels. The multi-level architecture of amplifiers permits the operation of the power supply without a full swing.

Figure 5:
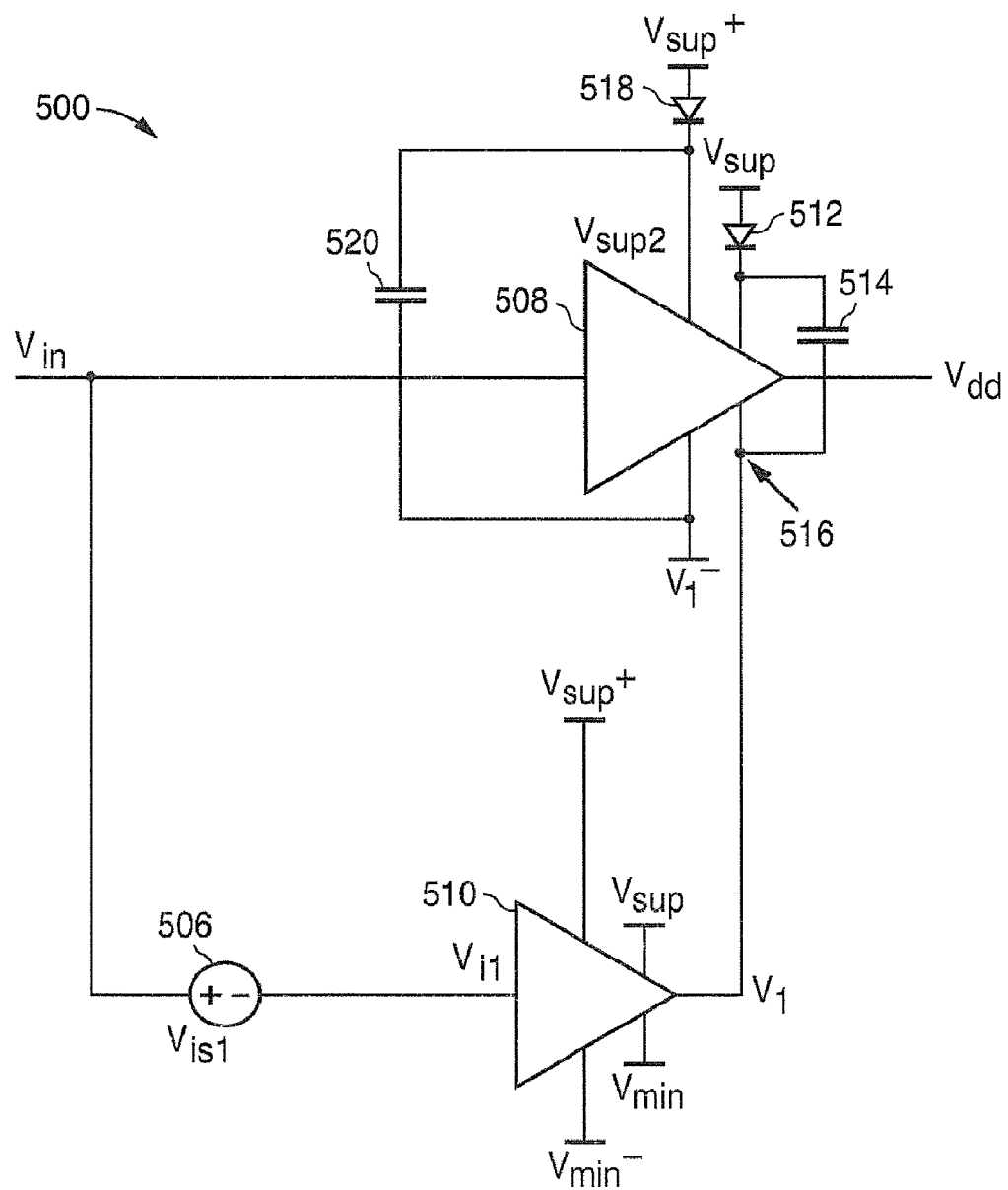

FIG. 5 may be an implementation of the efficient envelope tracking power supply using a class-G driver supply (i.e., the output rails having less headroom than the drivers). In FIG. 5, a linear amplifier 500, a level shifter 506, and amplifiers 508-510 are in the same arrangement as shown in FIG. 4. In this example, however, the amplifier 510 includes four power supply inputs, including $V_{sup}$, $V_{sup}+$, $V_{min}-$ and $V_{min}$. The $V_{sup}+$ could represent the $V_{sup}$ voltage plus an additional voltage (such as 3V). The $V_{min}-$ could represent the $V_{min}$ voltage minus the additional voltage.

The linear amplifier 500 also includes a diode 512 coupled to the supply voltage $V_{sup}$ and a capacitor 514 coupled to the diode 512. The linear amplifier 500 can further include a diode 518 coupled to the amplifier 508 and a capacitor 520 coupled across the supply voltages $V_{sup}+$ and $V_1-$ of the amplifier 508. The output from the amplifier 510 is fed into a node connected to the amplifier 508 and to the capacitor 514. In this embodiment, dropout losses can be reduced to a secondary level by reducing headroom. Also shown in FIG. 5 are inputs for amplifier 508 output device and the amplifier 508 driver referred to as $V_1$ and $V_1-$. $V_1-$ and $V_1$ have a relationship such that $V_1-=V_1-V_{headroom}$, where $V_{headroom}$ could be a voltage similar to 3V. Once the headroom is reduced, the quiescent current loss is dominant over other losses, except for switcher loss. A more complicated implementation with additional levels may be used to remove substantially all of the headroom.

In the embodiment shown in FIG. 5, the voltages on the driver (upper) rails of the amplifiers 508-510 can be generated using one or more charge pump DC/DCs or one or more inductive floating supplies. When the top amplifier driver supply is implemented by a charge pump similar to the main supply, it needs a separate smaller amplifier with a bigger offset. This separate smaller amplifier should be very small and require low power as no significant power is required for the driver rail.

Although FIGS. 2 through 5 illustrate example embodiments of a linear amplifier used in the architecture of FIG. 1, various changes may be made to FIGS. 2 through 5. For example, other linear amplifiers having any number of levels could be used.

Figure 6:
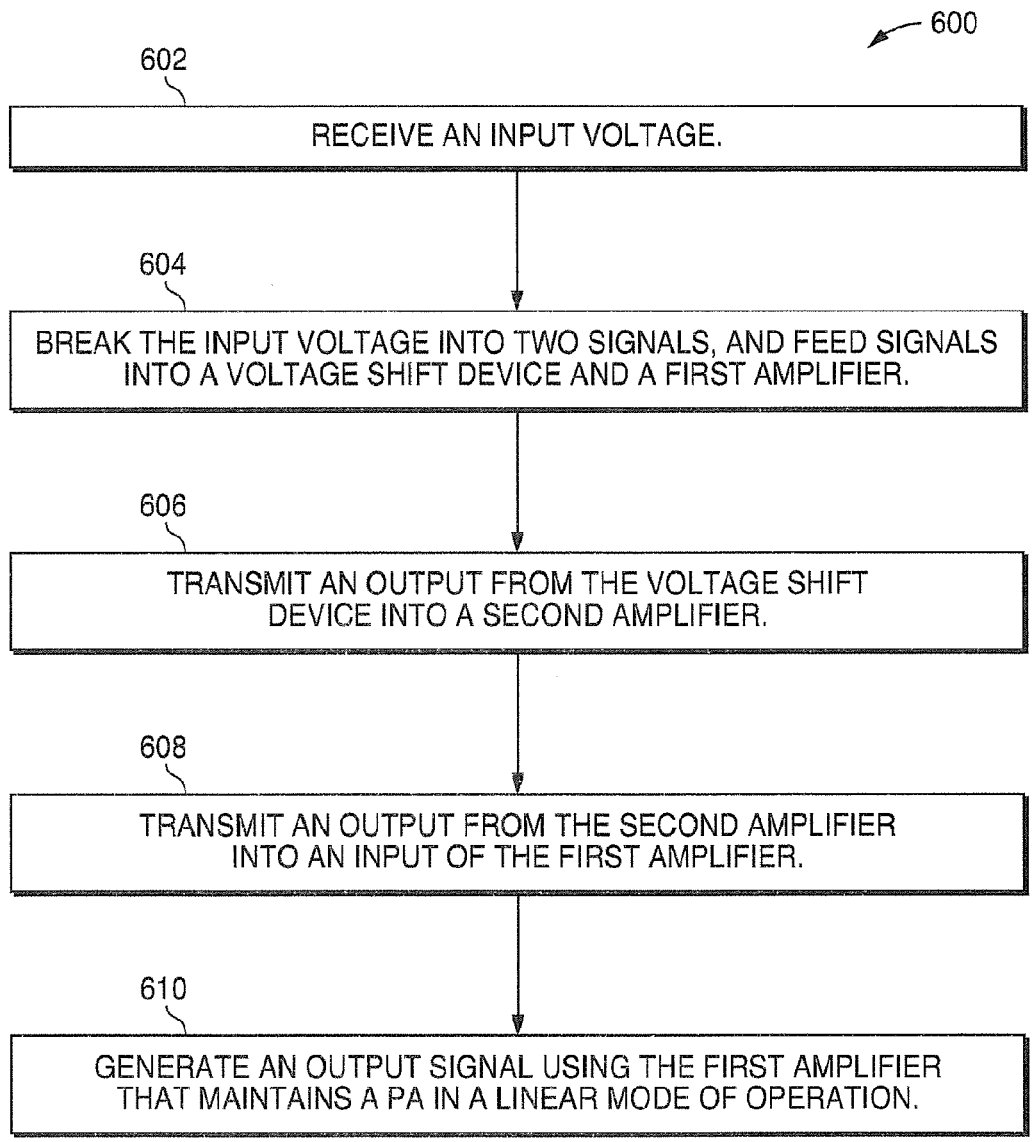
FIG. 6 illustrates an example method for envelope tracking according to this disclosure.

FIG. 6 illustrates an example method 600 for envelope tracking according to this disclosure. In step 602, an input voltage is received. In step 604, the input voltage is split into two signals. One signal is transmitted to a voltage shift device, and another signal is transmitted to a first amplifier. In step 606, an output from the voltage shift device is transmitted to a second amplifier. In step 608, an output from the second amplifier is transmitted to an input of the first amplifier. In step 610, an output signal is generated using the first amplifier that maintains a PA in a linear mode of operation.

Although FIG. 6 illustrates an example method 600 for envelope tracking, various changes may be made to FIG. 6. For example, while shown as a series of steps, various steps in FIG. 6 could overlap, occur in parallel, or occur multiple times.

Figure 7:
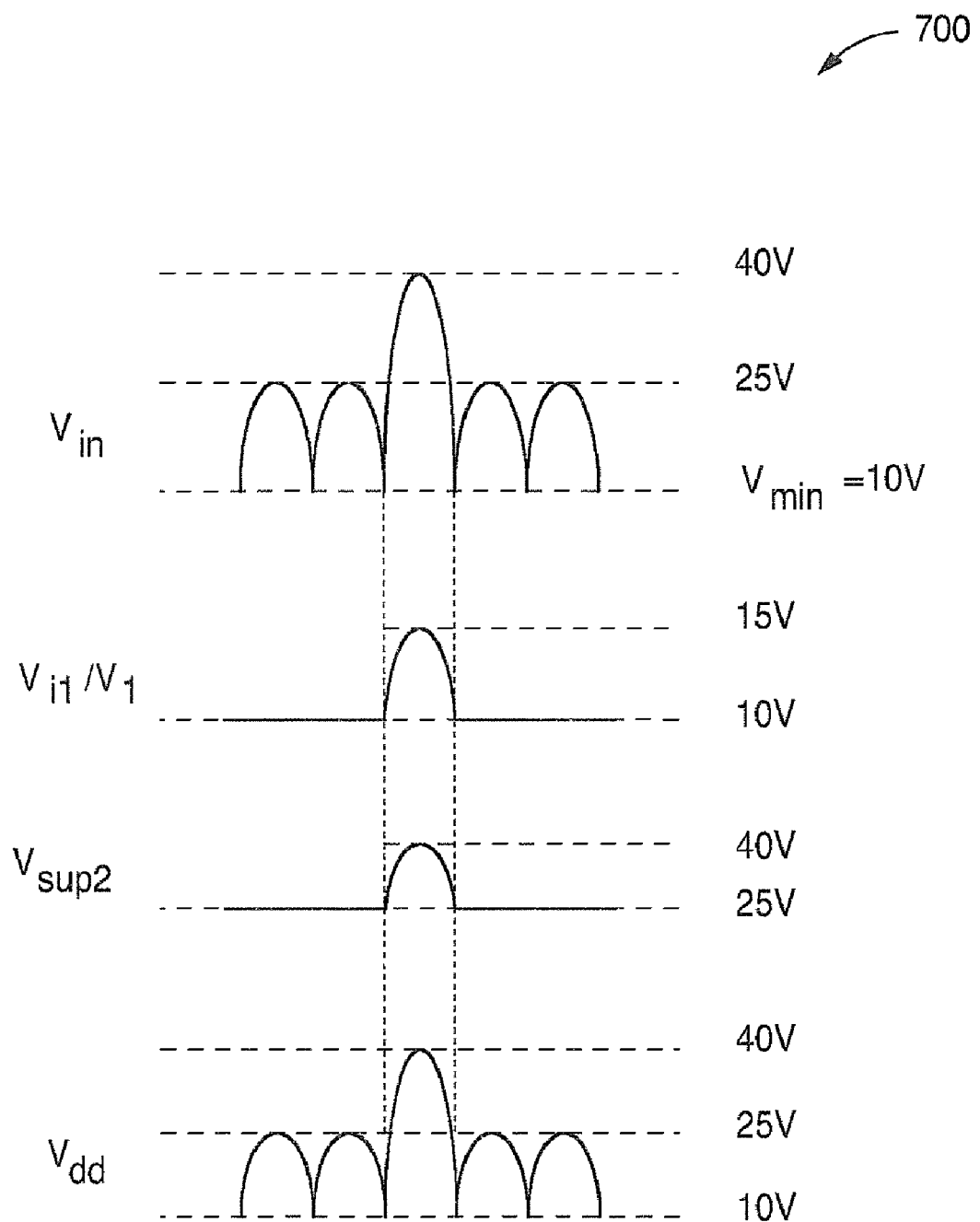
FIG. 7 illustrates a number of waveforms according to this disclosure.

FIG. 7 is an example of a plurality of waveforms 700 that may be present within the linear-assisted architecture 100 for power amplifier (PA) envelope tracking according to this disclosure. The signal names in the waveforms may be referring to the signals illustrated in FIG. 4. As shown in FIG. 7, when $V_{in}$ increases from 25V to 40V, $V_{sup2}$ increases from 25V to 40V at approximately the same time. In addition, $V_{il}/V_1$ and $V_{dd}$ also increase at approximately the same time as the increase in Vin and reflect the change in $V_{in}$. The level shifter 406 in FIG. 4 has a built-in clamp, as demonstrated from the $V_{il}$ waveform. With the clamp, the capacitor voltage will be maintained relatively constant independent of the input signal $V_{in}$.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A system comprising:
    a power amplifier configured to amplify an input signal; and
    a power supply comprising first and second amplifiers, the first amplifier configured to receive an input voltage and generate a supply voltage for the power amplifier, the second amplifier configured to receive a shifted input voltage, the first amplifier coupled to an upper supply rail and a lower supply rail, an output of the second amplifier coupled to the lower supply rail;
    wherein the first amplifier is configured to maintain an operational mode of the power amplifier.
2. The system of claim 1, wherein:
    the second amplifier is coupled to a second lower supply rail; and the power supply further comprises a third amplifier, an output of the third amplifier coupled to the second lower supply rail.

3. The system of claim 2, wherein the third amplifier is configured to receive a second shifted input voltage.

4. The system of claim 1, wherein the power amplifier comprises a radio frequency power amplifier.

5. A system comprising:
a power amplifier configured to amplify an input signal; and
a power supply comprising first, second, and third amplifiers;
the first amplifier configured to receive an input voltage and generate a supply voltage for the power amplifier, the first amplifier coupled to a first lower supply rail;
the second amplifier configured to receive a first shifted input voltage, the second amplifier coupled to a second lower supply rail, an output of the second amplifier coupled to the first lower supply rail;
the third amplifier configured to receive a second shifted input voltage, an output of the third amplifier coupled to the second lower supply rail;
wherein the first amplifier is configured to maintain an operational mode of the power amplifier;
wherein each of the first, second, and third amplifiers has an associated level within a stack; and
wherein a power supply voltage for each of the first, second, and third amplifiers is approximately equal to $V_{sup} = (V_{max} - V_{min})/N + V_{min}$, where $V_{sup}$ denotes the power supply voltage, $V_{max}$ denotes a maximum voltage input to that amplifier, $V_{min}$ denotes a minimum voltage input to that amplifier, and N denotes a number of stacked levels of the amplifiers in the stack.

6. A system comprising:
a power amplifier configured to amplify an input signal; and
a power supply comprising first and second amplifiers;
the first amplifier configured to receive an input voltage and generate a supply voltage for the power amplifier, the first amplifier coupled to a first upper supply rail and a first lower supply rail;
the second amplifier configured to receive a shifted input voltage, an output of the second amplifier coupled to the first lower supply rail;
wherein the power supply further comprises a first diode and a first capacitor coupled to the first amplifier, the first capacitor coupling the first upper and first lower supply rails.

7. The system of claim 6, wherein:
the second amplifier is coupled to a second upper supply rail and a second lower supply rail;
the power supply further comprises a third amplifier;
the third amplifier is configured to receive a second shifted input voltage, an output of the third amplifier coupled to the second lower supply rail; and
the power supply further comprises a second diode and a second capacitor coupled to the second amplifier, the second capacitor coupling the second upper and second lower supply rails.

8. The system of claim 7, wherein:
the first diode is coupled between an upper supply input of the first amplifier and the first upper supply rail, the first capacitor coupled between the first diode and the first amplifier; and
the second diode is coupled between an upper supply input of the second amplifier and the second upper supply rail, the second capacitor coupled between the second diode and the second amplifier.

9. A system comprising:
a power amplifier configured to amplify an input signal; and
a power supply comprising first and second amplifiers;
the first amplifier configured to receive an input voltage and generate a supply voltage for the power amplifier, the first amplifier coupled to a first upper supply rail, a first lower supply rail, a second upper supply rail, and a second lower supply rail;
the second amplifier configured to receive a shifted input voltage, an output of the second amplifier coupled to the first lower supply rail;
wherein the power supply further comprises:
a first diode and a first capacitor coupled to the first amplifier, the first capacitor coupling the first upper and first lower supply rails; and
a second diode and a second capacitor coupled to the first amplifier, the second capacitor coupling the second upper and second lower supply rails.

10. The system of claim 9, wherein the second amplifier comprises:
a first input configured to receive an upper power supply voltage from a third upper supply rail;
a second input configured to receive the upper power supply voltage plus a set voltage amount from a fourth upper supply rail;
a third input configured to receive a lower power supply voltage from a third lower supply rail; and
a fourth input configured to receive the lower power supply voltage minus the set voltage amount from a fourth lower supply rail.

11. The system of claim 9, wherein:
the first diode is coupled between a first upper supply input of the first amplifier and the first upper supply rail, the first capacitor coupled between the first diode and the first amplifier; and
the second diode is coupled between a second upper supply input of the first amplifier and the second upper supply rail, the second capacitor coupled between the second diode and the first amplifier.

12. A method comprising:
receiving an input voltage at a first amplifier, the first amplifier coupled to a first lower supply rail;
receiving a shifted input voltage at a second amplifier, the shifted input voltage lower than the input voltage;
providing an output of the second amplifier to the first lower supply rail; and
generating a supply voltage for a power amplifier using the first amplifier to maintain an operational mode of the power amplifier.

13. The method of claim 12, wherein the second amplifier is coupled to a second lower supply rail, and further comprising:
receiving a second shifted input voltage at a third amplifier, the second shifted input voltage lower than the first shifted input voltage; and
providing an output of the third amplifier to the second lower supply rail.

14. A method comprising:
receiving an input voltage at a first amplifier, the first amplifier coupled to a first lower supply rail;

receiving a first shifted input voltage at a second amplifier, the second amplifier coupled to a second lower supply rail;
providing an output of the second amplifier to the first lower supply rail;
receiving a second shifted input voltage at a third amplifier;
providing an output of the third amplifier to the second lower supply rail; and
generating a supply voltage for a power amplifier using the first amplifier to maintain an operational mode of the power amplifier;
wherein:
 each of the first, second, and third amplifiers has an associated level within a stack;
 the method further comprises supplying a power supply voltage to each of the first, second, and third amplifiers; and
 the power supply voltage for each of the first, second, and third amplifiers is approximately equal to $V_{sup} = (V_{max} - V_{min})/N + V_{min}$, where $V_{sup}$ denotes the power supply voltage, $V_{max}$ denotes a maximum voltage input to that amplifier, $V_{min}$ denotes a minimum voltage input to that amplifier, and N denotes a number of stacked levels of the amplifiers in the stack.

15. A method comprising:
receiving an input voltage at a first amplifier, the first amplifier coupled to a first upper supply rail and a first lower supply rail;
receiving a shifted input voltage at a second amplifier;
providing an output of the second amplifier to the lower supply rail; and
generating a supply voltage for a power amplifier using the first amplifier to maintain an operational mode of the power amplifier;
wherein generating the supply voltage comprises using a voltage stored in a first capacitor, the first capacitor coupled across the upper and lower supply rails.

16. The method of claim 15, wherein the second amplifier is coupled to a second upper supply rail and a second lower supply rail, and further comprising:
generating the output of the second amplifier using a voltage stored in a second capacitor, the second capacitor coupled across the second upper and second lower supply rails.

17. A method comprising:
receiving an input voltage at a first amplifier, the first amplifier coupled to a first upper supply rail, a first lower supply rail, a second upper supply rail, and a second lower supply rail;
receiving a shifted input voltage at a second amplifier;
providing an output of the second amplifier to the first lower supply rail; and
generating a supply voltage for a power amplifier using the first amplifier to maintain an operational mode of the power amplifier;
wherein generating the supply voltage comprises using:
 a first voltage stored in a first capacitor, the first capacitor coupled across the first upper and first lower supply rails; and
 a second voltage stored in a second capacitor, the second capacitor coupled across the second upper and second lower supply rails.

18. The method of claim 17, further comprising supplying the second amplifier with:
an upper power supply voltage at a first input of the second amplifier;
the upper power supply voltage plus a set voltage amount at a second input of the second amplifier;
a lower power supply voltage at a third input of the second amplifier; and
the lower power supply voltage minus the set voltage amount at a fourth input of the second amplifier.

19. An apparatus comprising:
an envelope tracking power supply configured to control a power amplifier, the power supply comprising:
 a first amplifier configured to receive an input voltage and generate a supply voltage for the power amplifier, the first amplifier coupled to an upper supply rail and a lower supply rail;
 a level shifter configured to shift the input voltage to a lower voltage level to generate a shifted input voltage; and
 a second amplifier configured to receive the shifted input voltage, an output of the second amplifier coupled to the lower supply rail;
wherein the first amplifier is configured to maintain an operational mode of the power amplifier.

20. The apparatus of claim 19, wherein:
the second amplifier is coupled to a second lower supply rail; and
the power supply further comprises a third amplifier, an output of the third amplifier coupled to the second lower supply rail, the third amplifier configured to receive a second shifted input voltage.

21. An apparatus comprising:
an envelope tracking power supply configured to control a power amplifier, the power supply comprising:
 a first amplifier configured to receive an input voltage and generate a supply voltage for the power amplifier, the first amplifier coupled to a first lower supply rail;
 a second amplifier configured to receive a shifted input voltage, the second amplifier coupled to a second lower supply rail, an output of the second amplifier coupled to the first lower supply rail; and
 a third amplifier configured to receive a second shifted input voltage, an output of the third amplifier coupled to the second lower supply rail;
wherein the first amplifier is configured to maintain an operational mode of the power amplifier;
wherein each of the first, second, and third amplifiers has an associated level within a stack; and
wherein a power supply voltage for each of the first, second, and third amplifiers is approximately equal to $V_{sup} = (V_{max} - V_{min})/N + V_{min}$, where $V_{sup}$ denotes the power supply voltage, $V_{max}$ denotes a maximum voltage input to that amplifier, $V_{min}$ denotes a minimum voltage input to that amplifier, and N denotes a number of stacked levels of the amplifiers in the stack.

22. An apparatus comprising:
an envelope tracking power supply configured to control a power amplifier, the power supply comprising:
 a first amplifier configured to receive an input voltage and generate a supply voltage for the power amplifier, the first amplifier coupled to a first upper supply rail and a first lower supply rail; and
 a second amplifier configured to receive a shifted input voltage, an output of the second amplifier coupled to the first lower supply rail;
wherein the first amplifier is configured to maintain an operational mode of the power amplifier; and wherein the power supply further comprises a first diode and a first capacitor coupled to the first amplifier, the first capacitor coupling the first upper and first lower supply rails.

23. The apparatus of claim 22, wherein:
the second amplifier is coupled to a second upper supply rail and a second lower supply rail;
the power supply further comprises a third amplifier;
the third amplifier is configured to receive a second shifted input voltage, an output of the third amplifier coupled to the second lower supply rail; and
the power supply further comprises a second diode and a second capacitor coupled to the second amplifier, the second capacitor coupling the second upper and second lower supply rails.

24. The apparatus of claim 23, wherein:
the first diode is coupled between a first upper supply input of the first amplifier and the first upper supply rail, the first capacitor coupled between the first diode and the first amplifier; and
the second diode is coupled between a second upper supply input of the first amplifier and the second upper supply rail, the second capacitor coupled between the second diode and the first amplifier.

25. An apparatus comprising:
an envelope tracking power supply configured to control a power amplifier, the power supply comprising:
    a first amplifier configured to receive an input voltage and generate a supply voltage for the power amplifier, the first amplifier coupled to a first upper supply rail and a first lower supply rail and to a second upper supply rail and a second lower supply rail; and
    a second amplifier configured to receive a shifted input voltage, an output of the second amplifier coupled to the first lower supply rail;
wherein the first amplifier is configured to maintain an operational mode of the power amplifier; and
wherein the power supply further comprises:
    a first diode and a first capacitor coupled to the first amplifier, the first capacitor coupling the first upper and first lower supply rails; and
    a second diode and a second capacitor coupled to the first amplifier, the second capacitor coupling the second upper and second lower supply rails.

26. The apparatus of claim 25, wherein:
the first diode is coupled between a first upper supply input of the first amplifier and the first upper supply rail, the first capacitor coupled between the first diode and the first amplifier; and
the second diode is coupled between a second upper supply input of the first amplifier and the second upper supply rail, the second capacitor coupled between the second diode and the first amplifier.

* * * * *